United States Patent [19]
Hada

[11] Patent Number: 6,156,464
[45] Date of Patent: Dec. 5, 2000

[54] SCANNING-TYPE CHARGED-PARTICLE BEAM EXPOSURE METHODS INCLUDING SCAN-VELOCITY ERROR DETECTION AND CORRECTION

[75] Inventor: Kazunari Hada, Ichihara, Japan

[73] Assignee: Nikon Corporation, Tokyo, Japan

[21] Appl. No.: 09/261,059

[22] Filed: Mar. 2, 1999

[30] Foreign Application Priority Data

Mar. 2, 1998 [JP] Japan ................................. 10-063877
Jan. 6, 1999 [JP] Japan ................................. 11-000922

[51] Int. Cl.⁷ ........................................................ G03F 9/00
[52] U.S. Cl. .............................. 430/30; 430/296; 430/942
[58] Field of Search ............................... 430/30, 296, 942

[56] References Cited

U.S. PATENT DOCUMENTS 5,879,842  3/1999  Okino ...................................... 430/296

*Primary Examiner*—Christopher G. Young
*Attorney, Agent, or Firm*—Klarquist Sparkman Campbell Leigh & Whinston, LLP

[57] ABSTRACT

Methods are disclosed for improving the yield of acceptable product from microlithography using a charged particle beam. According to the methods, exposure defects caused by an unsuitable stage velocity are reduced, and exposure-defect areas can be re-exposed after detection of an exposure defect. In preparation for exposure, pattern data are read. Next, stage position is read, and stage velocity is calculated. A determination is made of whether the stage velocity is greater than a specified value. If the stage velocity is greater than the specified value, the stage velocity is decreased to avoid exceeding a velocity limit at which continuous exposure is impossible. Exposure of the die commences. If exposure of all of the pattern portions of the die are successfully completed, then processing is terminated. If exposure of all the pattern portions were not successfully completed, processing returns to the step at which the error occurred and repeated.

18 Claims, 5 Drawing Sheets

SCANNING-TYPE CHARGED-PARTICLE BEAM EXPOSURE METHODS INCLUDING SCAN-VELOCITY ERROR DETECTION AND CORRECTION

FIELD OF THE INVENTION

This invention pertains to microlithography apparatus and methods employing a charged particle beam (e.g., electron beam) for transferring a pattern, defined by a mask or reticle, onto a suitable substrate such as a semiconductor wafer. Such apparatus and methods have especial utility in the manufacture of LSI integrated circuits, displays, etc.

BACKGROUND OF THE INVENTION

Charged-particle-beam (CPB) microlithography apparatus and methods have substantial potential for manufacturing VLSI devices having feature sizes significantly smaller than obtainable with optical microlithography apparatus and methods. Certain CPB apparatus that have been proposed and investigated recently include so-called "spot beam" exposure systems, "variable-shaped-beam" exposure systems, "block" exposure systems, and "divided" projection-transfer systems.

In most CPB microlithography apparatus, an image of a pattern is defined by a mask or reticle (termed generally "reticle" herein). An image of the reticle is projected onto the surface of a wafer or other suitable substrate (termed generally "wafer" herein). In such apparatus, the reticle is normally mounted on a reticle stage and the wafer is mounted on a wafer stage. In other CPB apparatus, the pattern is "written" directly onto the wafer (mounted on a wafer stage) by the charged particle beam without using a reticle at all.

In view of the above, CPB microlithography apparatus can be categorized into two general types. Apparatus of the first type either lack a reticle or, if a reticle is used, the reticle does not move to effect exposure. Rather, the wafer stage continuously moves during the exposure of the pattern onto the wafer. Hence, with apparatus of the first type, the instantaneous exposure location on the wafer is defined by the wafer-stage position and the beam position (as established by one or more deflectors). Apparatus of the second type utilize a reticle and a wafer, and both the reticle and wafer (mounted on respective stages) continuously and synchronously move during exposure of the pattern onto the wafer. Hence, with apparatus of the second type, the instantaneous exposure location on the wafer is defined by the wafer-stage position, the reticle-stage position, and the beam position (as established by one or more deflectors).

In many apparatus of the second type, the wafer stage and reticle stage are synchronously movable in opposite directions along a first dimensional axis (orthogonal to the optical axis) while the charged particle beam is swept along a second dimensional axis (orthogonal to both the optical axis and the first dimensional axis) so as to achieve a scanning exposure of the reticle pattern onto the wafer. During such scanning motion of the stages, the scanning (sweep) velocity of the charged particle beam is usually synchronized to the respective scanning velocities of the stages.

The amount of deflection that can be imparted to the beam, and the speed at which the beam can be deflected, are limited by the ability of the deflector(s) to laterally deflect the beam relative to the optical axis of the apparatus. Hence, every apparatus (whether of the first type or of the second type) has an optimal stage velocity for exposure, and it is possible for a stage (e.g., wafer stage) to have a velocity that is too high for the beam deflection achievable by the apparatus (termed generally a "beam-stage synchronization error"). If the stage velocity is only slightly in excess of the optimal velocity, then beam deflector(s) can usually make corrections needed to ensure accurate pattern transfer. However, if the stage velocity is more than slightly in excess of the optimal velocity, then the beam deflector(s) generally cannot keep up and continuous exposure becomes impossible.

In addition to beam-stage synchronization errors, continuous exposure also can be rendered impossible by (1) excessive synchronization error between the reticle stage and the wafer stage (apparatus of the second type only); (2) a change in beam intensity from what is optimally required for the exposure pattern, especially whenever the scanning velocity of the beam cannot be changed adequately (e.g., slowed) to accommodate such beam-intensity changes; (3) a deviation in the normal synchrononous relationship between stage velocity and exposure due to an irregularity in exposure time for a particular subfield of the reticle; (4) an excessive variation in surface elevation of the wafer and/or reticle; and (5) excessive yaw exhibited by the wafer stage and/or reticle stage.

In conventional CPB microlithography methods and apparatus, further exposure of the die being exposed on the wafer, or even of the remaining dies on the wafer, would be aborted at the moment a condition as listed above occurred. Further exposure could commence upon placing the next die (or the next wafer) into position for exposure. Unfortunately, with such conventional systems, the occurrence of such a problem can result in fatal defects in at least the subject chip, and even in the subject wafer, resulting in marked decreases in device yield per wafer.

SUMMARY OF THE INVENTION

The problems with conventional methods and apparatus summarized above are addressed by methods and apparatus according to the invention, of which an object is to prevent, in advance, exposure defects originating in, for example, mis-synchronization of stage velocity and pattern-exposure scanning velocity. Another object is to increase yield by re-exposing areas exhibiting exposure defects immediately after occurrence of the exposure defect, thereby preventing the production of defective chips or wafers.

According to a first aspect of the invention, methods are provided for solving the shortcomings of the conventional methods summarized above. A first representative embodiment of the method is directed to performing microlithography of a pattern onto a substrate using a charged particle beam. The substrate is mounted on a movable stage. The microlithography is performed by scanningly moving the stage at a stage velocity while continuously transferring successive portions of the pattern to the substrate using the charged particle beam.

The stage velocity is monitored. If the stage velocity is increased beyond a stage-velocity limit (which can be denoted $V_L$), continuous transfer of the pattern is impossible. A specified stage velocity (denoted $V_S$) used for performing actual exposure is typically less than $V_L$. This is because, if $V_S = V_L$, or if $V_S$ is only slightly less than $V_S$, then there may be instances (due to a slight variation in actual velocity normally experienced due to manufacturing tolerances and the like) when the stage velocity at a particular instant actually exceeds $V_L$. Therefore, the specified stage velocity VS is preferably less than $V_L$ by a "safety margin" $V_m$ sufficient to ensure that the stage velocity at any instant during exposure never exceeds $V_L$. Hence, as used herein, a specified stage velocity stated as being "near" the stage-velocity limit is less than the stage-velocity limit by the appropriate "safety margin."

So long as the actual stage velocity is at or less than the specified stage velocity, continuous exposure remains possible. (Of course, if the actual stage velocity is too low compared with the velocity with which the beam can be scanned, then a corresponding pause must be applied to beam before each exposure of a region on the wafer to allow the stage to "catch up."

Further according to the first representative embodiment, the stage velocity is reduced whenever the actual stage velocity is detected to be less than the stage-velocity limit ($V_L$) but exceeds the specified stage velocity ($V_S$) "near" the velocity limit. The specified stage velocity is appropriate to obtain a desired "pattern-exposure scanning rate" (a rate at which the reticle pattern can be scannably exposed onto the wafer). The pattern-exposure scanning rate reflects the speed at which parameters such as stage-velocity detection and correction can be achieved while maintaining continuous exposure. Whenever the actual velocity of the stage is increased above the stage-velocity limit, continuous exposure is impossible. Also, whenever the actual stage velocity is increased above the specified stage velocity, continuous exposure can be impossible. Hence, in either situation, the stage velocity is reduced sufficiently to re-establish a condition in which continuous transfer can proceed. Similarly, whenever the stage velocity is decreased below the specified stage velocity, the stage velocity is increased.

With many apparatus (i.e., apparatus of the second type and certain apparatus of the first type), the reticle is mounted on a reticle stage and the substrate is mounted on a substrate stage. During scanning exposure, at least one (preferably both) of the stages is moved. If both stages move, the reticle stage and wafer stage preferably move synchronously with each other at respective stage velocities during scanning exposure.

If for some reason the stage-velocity settings themselves are erroneous or if an actual (i.e., instantaneously measured) stage velocity deviates excessively from a respective pre-set specified stage velocity, the actual stage velocity cannot support ongoing continuous exposure of the pattern. Even if the actual stage velocity does not exceed the respective specified stage velocity, variations in exposure conditions (e.g., variations in beam current or variations in the exposure time for each exposure region of the reticle) can result in a drop in the pattern-exposure scanning rate which, in turn, can no longer be coordinated with the respective stage velocities.

If an actual stage velocity is too low relative to the pattern-exposure scanning rate, the pattern-exposure scanning rate can be reduced accordingly. On the other hand, if the actual stage velocity is too high relative to the pattern-exposure scanning rate (e.g., if the actual stage velocity exceeds an upper limit above which the pattern-exposure scanning rate cannot be achieved), then the beam will be directed to a location past (i.e., the beam will "overshoot") the desired exposure location on the substrate, making accurate exposure impossible. The first representative embodiment avoids such problems.

The stage-velocity limit is not necessarily an absolutely unchangeable value. Rather, the stage-velocity limit reflects the maximal or desired pattern-exposure scanning rate as defined by the prevailing exposure conditions.

The specified stage velocity "near" the stage-velocity limit is less than the stage-velocity limit by the "safety margin", as discussed above. By controlling stage velocity to not exceed the specified stage velocity, interruption of continuous exposure is prevented even if a controlled decrease in the stage velocity setting is delayed for some reason. The specified stage velocity can be established as a design and/or operational parameter of the charged-particle-beam exposure apparatus, or can be empirically determined after construction of the charged-particle-beam exposure apparatus.

According to a second representative embodiment, an improved method is provided for performing microlithography. A parameter associated with transfer of the die pattern to the substrate is monitored. During transfer of a stripe onto a die on the substrate, whenever an error condition is detected in the parameter such that continuous transfer of the die pattern to the substrate at a pattern-exposure scanning rate is impossible, the following occur: (1) Exposure of the stripe is stopped. (2) Advancement to the end of the stripe is effected without further exposing the stripe. (3) The parameter is adjusted to allow continuous transfer of the die pattern, and (4) the exposure continues at a subsequent stripe.

The phrase "continuous transfer of the die pattern to the substrate at a pattern-exposure scanning rate is impossible" refers to a situation in which normal exposure cannot be performed even if subsequent exposure is continued.

According to this representative embodiment, complete dies and wafers can be obtained despite the occurrence of errors or anomalies because re-exposure is performed in areas that were not exposed.

Exposure conditions can be changed to allow normal exposure of the next stripe or die. Although such a practice can make an entire die defective, overall yield from one or more wafers is increased (compared to conventional methods and apparatus) because the adjacent die can be normal even if the stripe or die in which the error occurred is deemed defective. Changing the exposure conditions refers to any change for the purpose of synchronizing the movement of the reticle and wafer with the pattern-exposure scanning. E.g., changing the stage velocity or changing the pattern-exposure scanning rate can change the dose received from the charged particle beam.

Determining which specific conditions to change is determined by the parameter that made exposure impossible in the first place. For example, if the heights of the wafer surface and reticle surface vary from location to location, an image can be properly formed on the wafer surface by, e.g., manipulating a positioning mechanism (such as piezoelectric actuators) to change the relative height(s). Afterward, exposure of subsequent stripes, dies, or wafers can be performed under the newly set conditions.

According to a third representative embodiment, a parameter associated with transfer of the die pattern to the substrate is monitored. During transfer of a stripe onto a die on the substrate, whenever an error condition is detected in the parameter such that continuous transfer of the die pattern to the substrate at a pattern-exposure scanning rate is impossible, the following are performed: (1) Exposure of the stripe is stopped at a location where the error condition was detected. (2) Positioning proceeds to the end of the stripe without further exposing the stripe. (3) The rate parameter is adjusted to allow continuous transfer of the die pattern, and (4) exposure is continued at a location in the stripe subsequent to the location where the error condition was detected. In this method, the end of the stripe can represent an end of a first or intermediate stripe of the die on the substrate, wherein exposure is continued at a subsequent stripe of the die on the substrate.

Alternatively, the end of the stripe can represent an end of the die on the substrate, wherein exposure is continued at a first stripe of a subsequent die on the substrate. Further alternatively, the end of the stripe can represent an end of the last die on the substrate, wherein exposure is continued at a first stripe of a first die on a subsequent substrate.

Impossibility of continuous exposure can arise due to various causes, as noted above. Whenever exposure is rendered impossible, exposure is stopped at that point and the scanning sequence is advanced to the end of the culprit stripe, die, or wafer associated with the point at which exposure was stopped. Such advancement is made without performing any exposure ("dummy advance"). Then, after advancing to the end of the culprit stripe, die, or wafer, the exposure conditions are changed as required to permit resumption of exposure. Then, exposure is resumed under the new conditions from the portion in which exposure was aborted. Since previously unexposed portions of the wafer are now exposed, defective chips caused by exposure defects are eliminated and yield improved.

According to a fourth representative embodiment, a parameter associated with transfer of the die pattern to the substrate is monitored. During transfer of a stripe onto a die on the substrate, and whenever an error condition is detected in the parameter such that continuous transfer of the die pattern to the substrate at a pattern-exposure scanning rate is impossible, the following occur: (1) Exposure of the stripe is stopped at a location where the error condition was detected. (2) The rate parameter is adjusted to allow continuous transfer of the die pattern, and (3) exposure is continued at a location in the stripe subsequent to the location where the error condition was detected. With this method, throughput is increased compared to the third representative embodiment because the dummy scan performed in the third representative embodiment is eliminated in the fourth representative embodiment. The changes in exposure parameters are similar to those summarized above with respect to the second representative embodiment.

In the method of this embodiment, step (3) can comprise moving the reticle and substrate to return to a beginning of the stripe in which the error condition was detected. Scanning is re-initiated at that beginning, but exposure recommences at the location in the stripe subsequent to the location where the error condition was detected.

Alternatively, step (3) can comprise moving the reticle and substrate to return to a location in the stripe immediately subsequent to the location where the error condition was detected. Scanning exposure of the stripe is re-initiated at that location. This method is more complex than the preceding method because scanning is re-started from the unexposed location. However, throughput is improved since there is no dummy advance, in contrast to the preceding method.

The foregoing and additional features and advantages of the invention will be more readily apparent from the following detailed description, which proceeds with reference to the accompanying drawings.

DETAILED DESCRIPTION

Representative embodiments of this invention are described below, in connection with the figures. Since the description is made in connection with a divided transfer-exposure apparatus employing a charged particle beam (but is not limited to such apparatus), certain aspects of a divided transfer-exposure system are described in connection with FIG. 6.

In general, the present invention is applicable to CPB methods and apparatus involving either apparatus of the first type or apparatus of the second type. As discussed above, apparatus of the first type either lack a reticle or, if a reticle is used, the reticle does not move to effect exposure. Rather, the wafer stage continuously moves during the exposure of the pattern onto the wafer. Hence, with apparatus of the first type, the instantaneous exposure location on the wafer is defined by the wafer-stage position and the beam position (as established by one or more deflectors). Apparatus of the second type utilize a reticle and a wafer, and both the reticle and wafer (mounted on respective stages) continuously and synchronously move during exposure of the pattern onto the wafer. Hence, with apparatus of the second type, the instantaneous exposure location on the wafer is defined by the wafer-stage position, the reticle-stage position, and the beam position (as established by one or more deflectors).

Figure 6:
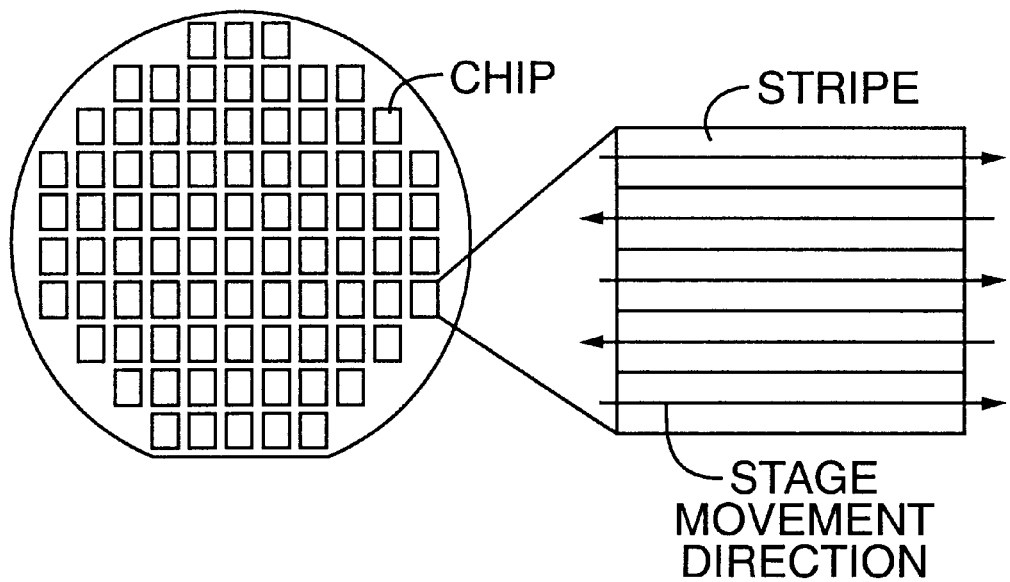
FIG. 6 illustrates certain general principles of a divided transfer-exposure system with which the present invention can be practiced.

In divided CPB transfer-exposure apparatus, a reticle is used that defines a pattern for a chip or "die". The reticle is divided into multiple discrete pattern portions (termed herein "subfields"). Transfer-exposure of the die is performed by individually exposing the subfields in a sequential manner to transfer respective images of the subfields to corresponding exposure locations on the substrate (e.g., wafer). On the reticle, the subfields are typically grouped into several fields called "stripes," as shown in FIG. 6. Thus, each stripe can contain multiple subfields (subfields are not shown in FIG. 6).

Exposure of a stripe is generally performed using a charged-particle-beam (CPB) exposure apparatus. If the exposure apparatus is of the second type, as discussed above, then the reticle is mounted on a movable reticle stage and the wafer is mounted on a movable wafer stage. During exposure, the reticle stage and wafer stage are synchronously moved in opposite directions in a plane transverse to an optical axis of the system. As each subfield is individually illuminated for exposure, a portion of the charged particle beam passes through the illuminated subfield and produces an image of the illuminated subfield on a corresponding location on the wafer. After completing exposure of all the regions (e.g., subfields) in a stripe, exposure proceeds to the next stripe.

Alternatively, according to another scheme of divided transfer-exposure, the reticle is divided into stripes (FIG. 6), but each stripe is not further divided into discrete subfields. Rather, the stripes are divided into areas called "slots" that are typically larger than subfields. The difference between a subfield and a slot is that, whereas the respective pattern portions in subfields are exposed and transferred sequentially and individually to the wafer using respective "shots" of charged particles, the respective pattern portions in slots are sequentially exposed and transferred to the wafer by scanning each slot with the charged particle beam. Despite this difference between slots and subfields, the present invention has utility in either case; i.e., either type of reticle can be used. For simplicity, the following description is in the context of a reticle comprising stripes and subfields; however, it will be understood that the scope of the invention is not limited to such reticles.

To ensure proper positioning of the projected portions of the reticle pattern, a map of the coordinates of the desired locations of the projected portions (e.g., of each subfield, slot, stripe, or die) can be stored in a memory for recall as the respective portions are projected.

Figure 1:
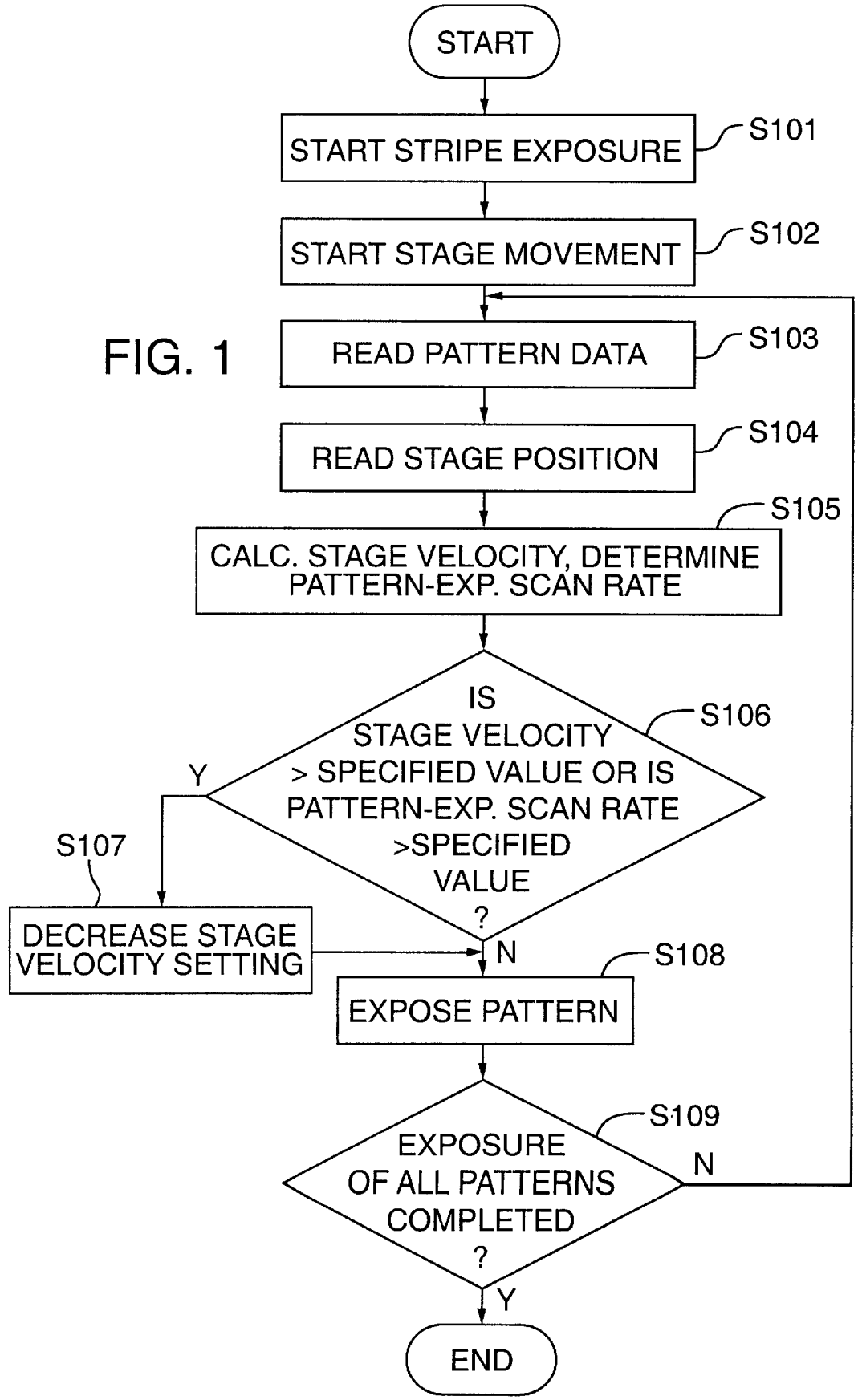
FIG. 1 is a flow chart of a routine for modifying stage velocity, according to a representative embodiment of the invention, whenever an error in stage velocity is detected.

A first representative embodiment of a method according to the invention is depicted in FIG. 1. The FIG. 1 embodiment is particularly directed to an operational routine for exposing a stripe. When exposure of the stripe is completed, the next stripe is positioned for exposure and the depicted routine is repeated. The routine is repeated as required to complete exposure of the entire die.

Referring to FIG. 1, with the start of stripe exposure (S101), appropriate movement of the stage(s) also commences (S102). Pattern data (e.g., coordinates of the region being currently exposed) are read from a memory as the first step of exposure (S103). Next, the actual position(s) of the stage(s) is read (S104). (Stage positions are normally "read" using laser interferometers, as known in the art, placed in association with each stage.) The stage-position data can be used to calculate the respective stage velocity(ies), from which a determination of the respective pattern-exposure scanning rate can be made (S105).

The "pattern-exposure scanning rate" can be understood by considering a stripe comprising a linear array of subfields arranged with their width dimensions "L" oriented transversely to the longitudinal dimension of the stripe. The pattern-exposure scanning rate is expressed as $L/[n(t_{exp}+t_{set})]$, wherein $t_{exp}$ is the exposure time of each individual subfield in the stripe, $t_{set}$ is the settling time (from one subfield to the next in the stripe) of the deflector used to deflect the beam, and "n" is the number of subfields in the stripe. Similar to stage velocity, the pattern-exposure scanning rate is preferably below a threshold limit above which continuous exposure is impossible, and further preferably below a specified value that is less than but "near" (taking into account a "safety factor") the threshold limit.

Next (S106), a determination is made of whether the stage velocity(ies) is greater than the respective specified stage velocity(ies), and of whether the pattern-exposure scanning rate is greater than its specified value. The specified stage velocity is preferably less than but "near" the corresponding stage-velocity limit, and the specified pattern-exposure scanning rate is preferably less than but "near" its threshold limit. These values are appropriately selected from characteristics of the system that control stage velocity.

The pattern-exposure scanning rate is detected at this point because the beam current can vary. Whenever the beam current increases, it is preferred that the pattern-exposure scanning rate controllably increase to a correspondingly higher rate; whenever the beam current decreases, it is preferred that the pattern-exposure scanning rate controllably decrease to a correspondingly lower rate.

Whenever a stage velocity is less than its specified stage velocity, a synchronization error can arise between the stage velocity and the pattern-exposure scanning rate. Detecting and monitoring the pattern-exposure scanning rate is important in the prevention of such synchronization errors.

If the stage velocity(ies) is detected to be greater than the respective specified stage velocity for a particular pattern-exposure scanning rate, or whenever the pattern-exposure scanning rate is greater than its specified rate, the respective stage velocity is correspondingly decreased (S107). This avoids any danger of the actual stage velocity exceeding its respective stage-velocity limit.

Next, the pattern in the stripe is exposed (S108), and a determination is made of whether exposure of all the pattern portions of the stripe have been completed (S109). If exposure of the stripe is completed, processing with respect to that stripe is terminated. If exposure of the stripe is not completed, the process returns to step S103 and is repeated for the next stripe, and so on for all the stripes of the die.

In this embodiment, continuous exposure can be performed without generating an exposure error because stage velocity(ies) can be reduced before exposure actually becomes impossible.

Figure 2:
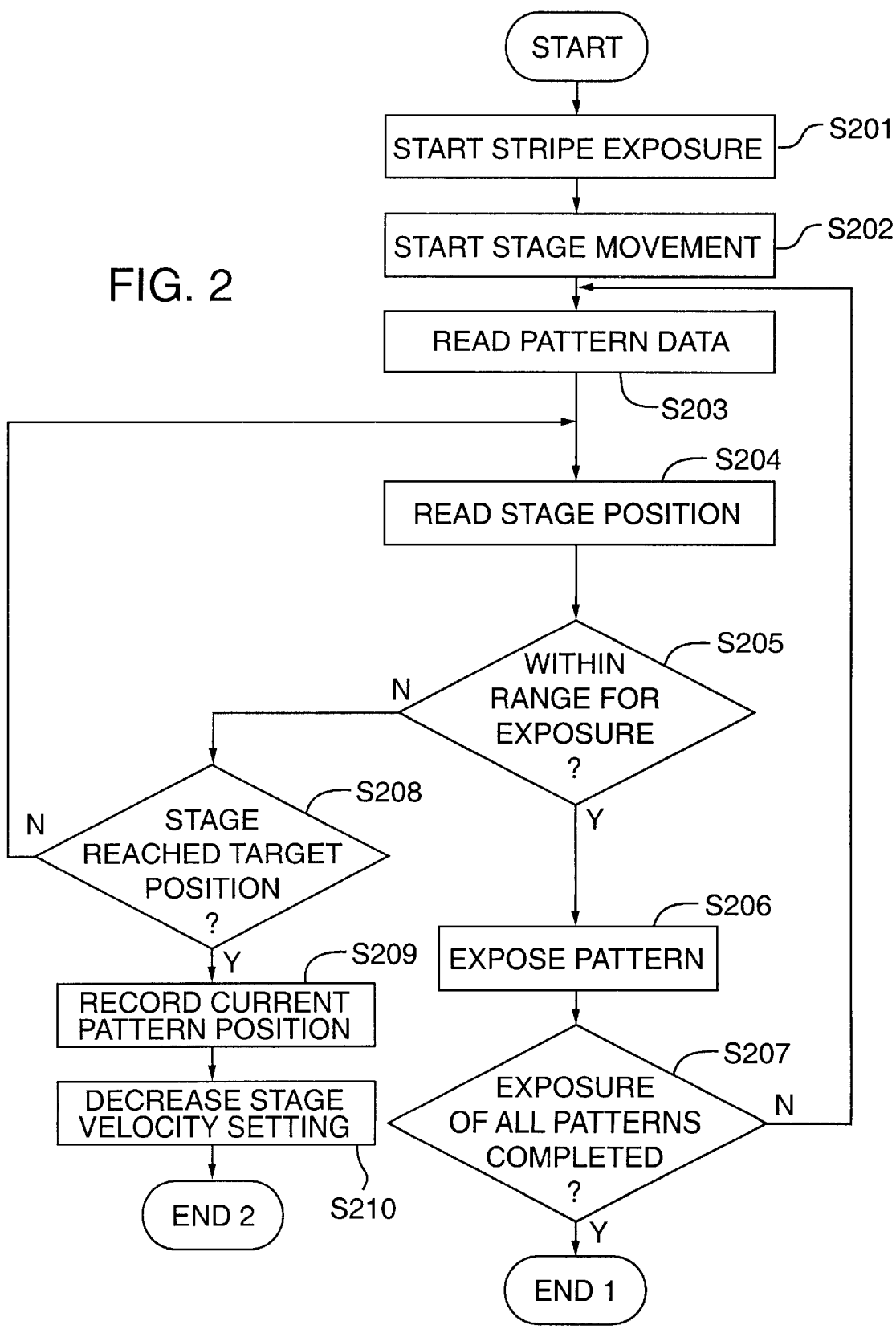
FIG. 2 is a flow chart of a routine for error recovery according to a first representative embodiment.

A second representative embodiment is shown in FIG. 2, which is directed especially to detection of an error condition and subsequent processing. FIG. 2 depicts a situation in which attainment of synchronous stage movement and pattern exposure have become impossible.

First, with the beginning of stripe exposure (S201), coordinated movements of the reticle stage and wafer stage commence (S202). Pattern data (e.g., data on coordinates of the pattern region currently being exposed) are read out as the first step of exposure (S203). Next, the actual stage positions are determined (S204). Then, a calculation is made (using the respective pattern-region coordinate data and data concerning actual stage positions) to determine if any significant difference exists between the respective positions of the stages at which exposure should be performed and the corresponding actual stage positions. A determination is made as to whether the calculated differences are within respective ranges in which accurate exposure can be performed (e.g., whether each calculated difference is within a range in which the exposure beam can be deflected) (S205).

If the calculated differences are within the corresponding permissible range, then an exposure is performed (S206). A determination is then made of whether the exposure completes exposure of all pattern portions within the current stripe (S207). If exposure of the stripe is not completed, the process returns to step S203 to continue the routine. After completing exposure of the stripe, data are recorded indicating that the constituent portions (e.g., subfields) of the stripe were properly exposed.

If a calculated difference is not within a corresponding permissible range, a determination is made of whether the respective stage had reached its target position (S208) for exposure. If the stage had not reached its target position, then the stage position is re-read and the system is placed in a standby mode until the stage reaches the target position for exposure. If exposure is impossible because a stage velocity has already exceeded the permissible range for exposure, data concerning the current stage position as well as the particular pattern portion being exposed, the stage velocity, the stage-movement starting position, stage-movement target position, etc., are recorded (S209). The stage velocity is further decreased and exposure in the subject stripe is terminated (S210).

Recording the current pattern position (S209) also involves recording the particular die in which an anomaly occurred, which stripe of the particular die was being exposed when the anomaly occurred, and the particular region (e.g., subfield) in the stripe in which the anomaly occurred. Data concerning the particular region within the stripe in which the anomaly occurred can be utilized as an address when reading pattern data. Alternatively, data indicating the order in which regions are exposed may be added in advance to the pattern data, and such data can be recorded at the region at which the anomaly occurred.

The amount by which a deviant stage velocity is decreased may be determined by establishing a factor (<1) in advance. A new stage velocity can be determined by multiplying the current stage velocity by the factor or by subtracting a predetermined velocity increment from the current velocity.

Upon completing exposure of a stripe, if the exposure was completed normally (END1), the routine proceeds to the next stripe of the die. If exposure was completed for the last stripe of a die, then processing proceeds to exposure of the next die. If exposure was completed for the last stripe of the last die on the wafer, then processing proceeds to exposing the next wafer.

If the exposure is completed on an anomaly or error (END2), then the process shifts to an error-processing routine. For example, according to a first representative embodiment of an error-processing routine, after terminating exposure of a stripe in which an error occurred, a change is made in the exposure conditions and/or the scanning conditions at the start of exposure of the subsequent stripe, followed by commencement of exposure of the subsequent stripe. If the error, detected by the routine as shown in FIG. 2, arose from an inability to synchronize movement of a stage with exposure of the respective pattern portion, further processing may involve one of the following: (1) Exposure of the subsequent stripe without modifying either the exposure conditions or the scanning conditions. (The stage velocity already will have been changed in step S210.) (2) After stopping exposure of the die including the culprit region in which the error occurred, the exposure conditions and/or the scanning conditions are changed so that normal pattern exposure can be resumed for subsequent dies on the wafer. Pattern exposure is re-started beginning with the starting position of the next die. (3) After stopping exposure of the wafer including the culprit region in which the error occurred, the exposure conditions and/or the scanning conditions are changed so that normal pattern exposure can be resumed for subsequent wafers. Pattern exposure is re-started beginning with the starting position of the next wafer.

With respect to any of (1)–(3), above, the locations of unexposed regions remaining on wafers on which an error occurred can be recorded. The unexposed regions can be exposed later if desired.

Figure 3:
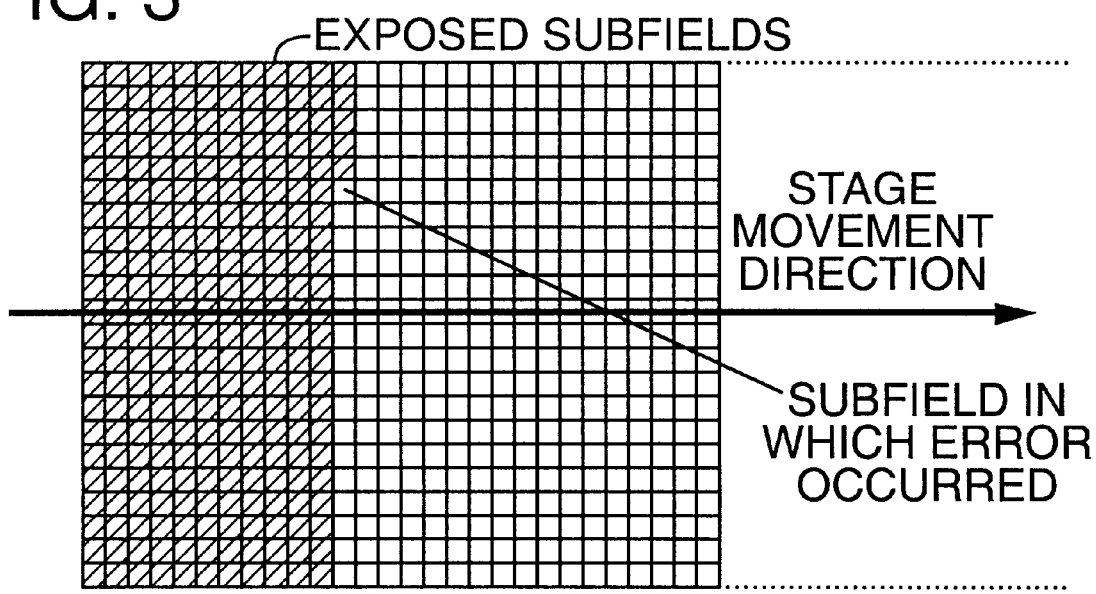
FIG. 3 is a plan view of a representative status of exposure of reticle subfields within a stripe at the moment an error occurs in a particular subfield of the stripe.
Figure 4:
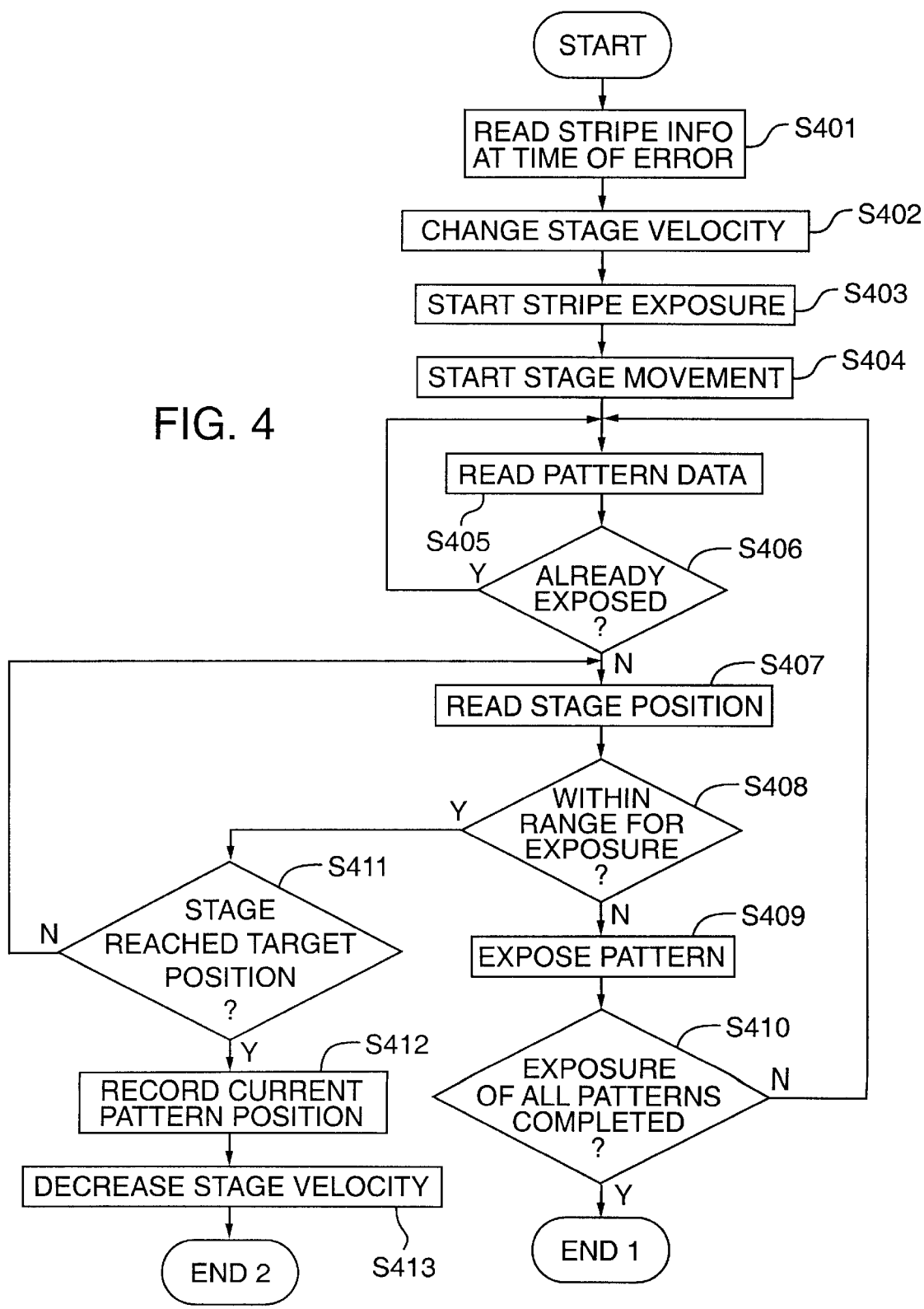
FIG. 4 is a flow chart of a routine for error recovery according to a second representative embodiment.

A second error-processing routine is illustrated in FIGS. 3 and 4. FIG. 3 shows a representative subfield array in a stripe of which exposure could not be completed due to an error. The shaded subfields denote subfields in which exposure was actually completed, and the unshaded subfields denote yet-unexposed subfields. Thus, in this figure, an error condition has been detected according to the routine shown in FIG. 2; exposure of subfields subsequent to the culprit subfield (in which the error occurred) is terminated and the remainder of the stripe is left unexposed.

The flow chart shown in FIG. 4 depicts the sequence of recovery processing for the unexposed subfields in the stripe of FIG. 3. In FIG. 4, the error is characterized by an inability to synchronize stage movement with pattern exposure. The routine shown in FIG. 4 is contiguous with the routine shown in FIG. 2. According to a first step in FIG. 4, information regarding the stripe in which the error occurred is read (S401). This information includes, for example, data concerning the position in the die of the pattern portion (subfield in this instance) in which the error occurred and other stripe information (e.g., stage-movement velocity, the starting position of stage movement, the target position of stage movement, etc.) recorded during the step S209 of the FIG. 2 routine. The sensed stage velocity is multiplied by a desired factor (<1) or is slowed by a desired velocity (S402). (Such processing is unnecessary if already performed during error-detection processing, such as during the processing step S210 in FIG. 2.)

Pattern exposure is started from the initial subfield of the stripe (S403). Movement of the stage commences from the starting position of the current stripe (S404). Subfield data are read (S405) and checked (S406) to determine which subfields were exposed during the previous exposure. If the checked subfields have already been exposed, then subsequent subfields are read and checked (without performing any exposure). Such reading and checking of subfield data continues until data are encountered pertaining to the subfield in which the error occurred. As shown in FIG. 3, the sequence that continues after detection of the culprit subfield is the same as that shown in FIG. 2.

Since each subfield is checked in this error-processing routine to determine whether exposure of each subfield has been completed, the routine can be applied not only to cases in which no exposure was performed after the culprit subfield, but also to cases in which subfields that were not exposed appear intermingled with subfields that were exposed in a stripe or die.

Figure 5:
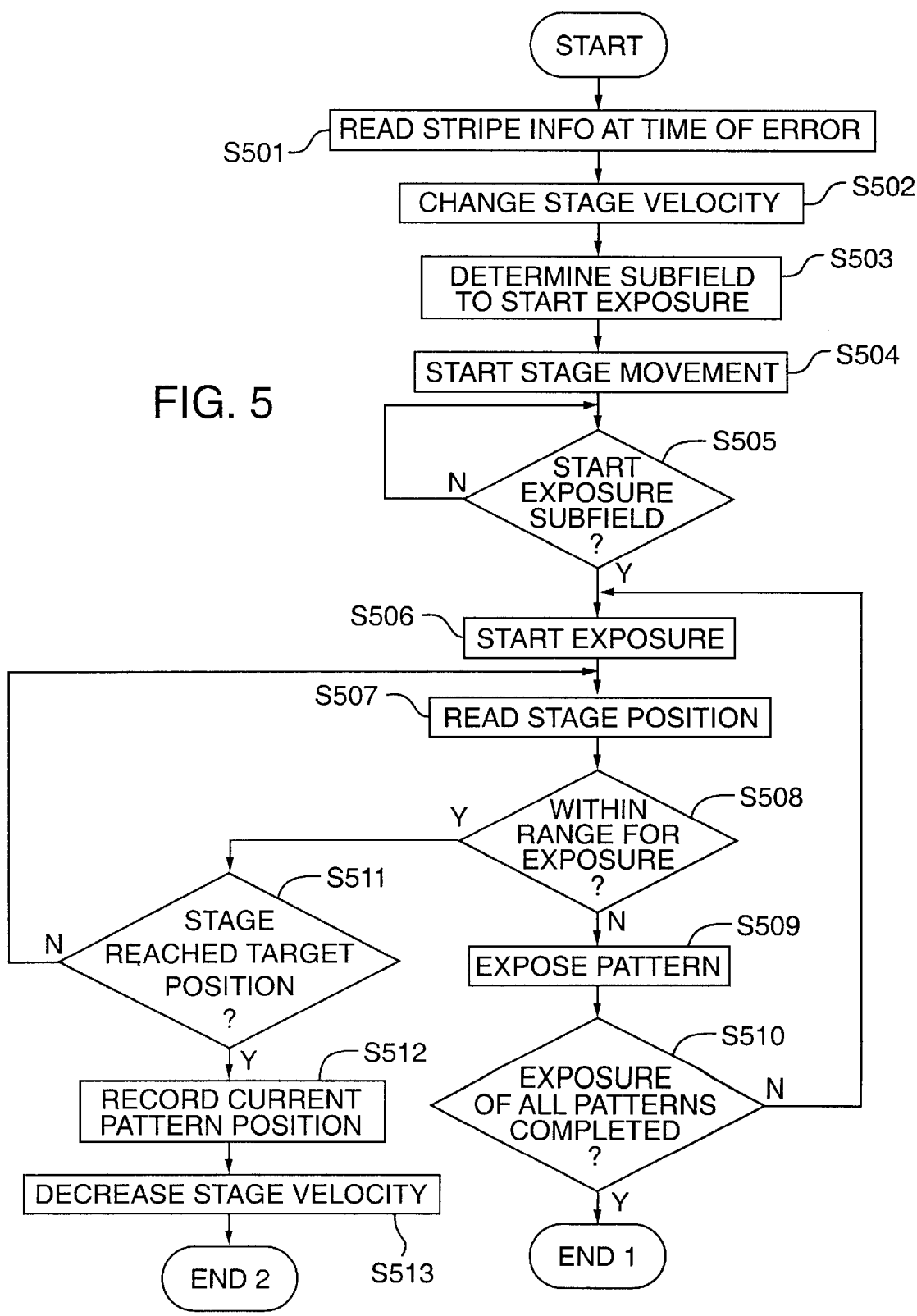
FIG. 5 is a flow chart of a routine for error recovery according to a third representative embodiment.

A third representative error-processing routine is shown in FIG. 5. This routine can also be applied to errors in which the stage movements and pattern exposure could not be synchronized. The routine pertains to recovery processing upon stopping exposure after the culprit subfield or other region (in which the error occurred), as shown in FIG. 3. In the error-processing routine of FIG. 5, the first subfield or region to be re-exposed is not determined by steps S405 and S406 of FIG. 4; rather, the position of the subfield or region to be re-exposed is determined from data concerning the stripe at the time of the error (S501). Re-exposure is started after the stages are moved to that position.

Continuing further with FIG. 5, data pertaining to the culprit stripe in which the error occurred is read in step S501. Such data includes the pattern position at which the error occurred and other stripe data recorded during the step S209 shown in FIG. 2 (e.g., stage velocity, stage-movement start position, stage-movement target position, etc.). The stage-velocity setting is multiplied by a desired factor (<1) or is slowed by a desired velocity (S502). (This processing is unnecessary if it was already performed during error detection, as in the step S210 in FIG. 2.)

The position of the subfield or other region to be exposed first is determined from readings of the position of the pattern in which the error occurred (S503). Stage movements commence (S504). The stage positions are monitored to ascertain whether the stages have reached a start-exposure position (S505), at which exposure is started (S506). The subsequent steps, as shown in FIG. 5, are the same as shown in FIG. 2.

The following options represent the timing for implementing the second and third embodiments of the error-processing routines:

(1) When an error occurs, immediately shift to an error-processing routine.

(2) When an error occurs, execute a dummy exposure of the remainder of the stripe in which the error occurred, according to the preset exposure sequence. Perform error processing after the exposure scanning reaches the end of the stripe.

(3) When an error occurs, execute dummy exposure of subsequent contiguous stripes in the culprit die according to the preset exposure sequence. Perform error processing after the exposure scanning reaches the end of the last stripe of the culprit die.

(4) When an error occurs, execute dummy exposure of the subsequent contiguous stripes on the culprit wafer according to the preset exposure sequence. Perform error processing after the exposure scanning reaches the end of the last stripe of the last die on the wafer.

The foregoing description was provided in the context of a divided CPB transfer-exposure apparatus in order to simplify the description. However, the methods set forth above also can be applied readily to variable-shape exposure-type or block exposure-type CPB exposure apparatus and methods.

In the foregoing description, the specific parameter in which an error occurred concerned a stage velocity exceeding the respective preset value. However, it will be understood that the error can be due to any of various other causes including (but not limited to) the following:

(1) an excessive synchronization error between movements of the reticle stage and the wafer stage;

(2) a shift in the synchronous relationship between stage velocity and exposure due to the subfield exposure time texp having been adjusted:

(3) excessive variation in the height of the wafer surface; and (4) excessive yawing of the wafer stage or reticle stage.

By controlling the velocity of stage movement to allow a deliberate decrease in stage velocity in the event of a detected anomaly, the frequency of exposure errors can be decreased especially whenever stage velocity exceeds a velocity at which continuous exposure is possible. The methods described herein permit a marked reduction in the numbers of defective chips and defective wafers, thereby improving product yield. This is because, inter alia, pattern data can be recorded at the time an error occurs, and recovery from the error can be performed based on the recorded pattern data.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. In a method for performing microlithography of a pattern onto a substrate, using a charged particle beam, wherein at least the substrate is mounted on a movable stage, the microlithography being performed by scanningly moving the stage at a stage velocity while continuously transferring successive portions of the pattern to the substrate using the charged particle beam, an improvement comprising:

detecting actual stage velocity of the stage;

comparing the actual stage velocity against a pre-set stage-velocity limit above which continuous transfer of the pattern portions is impossible, and against a pre-set specified stage velocity less than but near the stage-velocity limit;

reducing the stage velocity if the actual stage velocity is less than the stage-velocity limit but greater than the specified stage velocity; and performing exposure of the pattern onto the substrate.

2. The method of claim 1, further comprising the step of monitoring the pattern-exposure scanning rate.

3. The method of claim 2, further comprising the step of monitoring beam current.

4. The method of claim 3, further comprising the step of reducing the pattern-exposure scanning rate whenever the beam current decreases by at least a respective threshold amount, and of increasing the pattern-exposure scanning rate whenever the beam current increases by at least a respective threshold amount.

5. The method of claim 3, further comprising the step of decreasing the actual stage velocity whenever the actual stage velocity is greater than appropriate to achieve a particular pattern-exposure scanning rate or the pattern-exposure scanning rate exceeds a pre-set specified scanning rate.

6. The method of claim 1, further comprising the step, whenever the actual stage velocity is detected to be less than the specified stage velocity, of increasing the actual stage velocity.

7. In a method for performing microlithography of a die pattern as multiple dies on a substrate using a charged particle beam, the die pattern being defined by multiple stripes on a reticle and at least one of the reticle and substrate being mounted on a movable stage, the microlithography being performed by scanningly moving the stage at a stage velocity while continuously transferring successive stripes of the die pattern to the substrate using the charged particle beam, an improvement comprising:

monitoring a parameter associated with transfer of the die pattern to the substrate; and during transfer of a stripe onto a die on the substrate, whenever an error condition is detected in the parameter such that continuous transfer of the die pattern to the substrate at a pattern-exposure scanning rate is impossible, (i) stopping exposure of the stripe; (ii) advancing to an end of the stripe without further exposing the stripe; (iii) adjusting the parameter to allow continuous transfer of the die pattern; and (iv) continuing exposure at a subsequent stripe.

8. The method of claim 7, wherein:

the end of the stripe represents an end of a first or intermediate stripe of the die on the substrate; and step (iv) comprises continuing exposure at a subsequent stripe of the die on the substrate.

9. The method of claim 7, wherein:

the end of the stripe represents an end of the die on the substrate; and step (iv) comprises continuing exposure at a first stripe of a subsequent die on the substrate.

10. The method of claim 7, wherein:

the end of the stripe represents an end of a last die on the substrate; and step (iv) comprises continuing exposure at a first stripe of a first die on a subsequent substrate.

11. The method of claim 7, wherein the parameter pertains to a velocity of the stage suitable for maintaining the pattern-exposure scanning rate.

12. The method of claim 11, wherein:

each of the reticle and the substrate are mounted on respective stages; and the parameter pertains to relative velocities of the reticle stage and substrate stage suitable for maintaining the pattern-exposure scanning rate.

13. In a method for performing microlithography of a die pattern as multiple dies on a substrate using a charged particle beam, the die pattern being defined by multiple stripes on a reticle and at least one of the reticle and substrate being mounted on a movable stage, the microlithography being performed by scanningly moving the stage at a stage velocity while continuously transferring successive stripes of the die pattern to the substrate using the charged particle beam, an improvement comprising:

monitoring a parameter associated with transfer of the die pattern to the substrate; and during transfer of a stripe onto a die on the substrate, whenever an error condition is detected in the parameter such that continuous transfer of the die pattern to the substrate at a patternexposure scanning rate is impossible, (i) stopping exposure of the stripe at a location where the error condition was detected; (ii) advancing to an end of the stripe without further exposing the stripe; (iii) adjusting the parameter to allow continuous transfer of the die pattern; and (iv) continuing exposure at a location in the stripe subsequent to the location where the error condition was detected.

14. The method of claim 13, wherein step (iv) comprises moving the reticle and substrate to return to a beginning of the stripe in which the error condition was detected, so as to re-initiate scanning at said beginning, but continuing exposure at the location in the stripe subsequent to the location where the error condition was detected.

15. The method of claim 13, wherein step (iv) comprises moving the reticle and substrate to return to a location in the stripe immediately subsequent to the location where the error condition was detected, and re-initiating scanning exposure of the stripe at said location.

16. In a method for performing microlithography of a die pattern as multiple dies on a substrate using a charged particle beam, the die pattern being defined by multiple stripes on a reticle and at least one of the reticle and substrate being mounted on a movable stage, the microlithography being performed by scanningly moving the stage at a stage velocity while continuously transferring successive stripes of the die pattern to the substrate using the charged particle beam, an improvement comprising:

monitoring a parameter associated with transfer of the die pattern to the substrate; and during transfer of a stripe onto a die on the substrate, whenever an error condition is detected in the parameter such that continuous transfer of the die pattern to the substrate at a pattern-exposure scanning rate is impossible, (i) stopping exposure of the stripe at a location where the error condition was detected; (ii) adjusting the parameter to allow continuous transfer of the die pattern; and (iii) continuing exposure at a location in the stripe subsequent to the location where the error condition was detected.

17. The method of claim 16, wherein step (iii) comprises moving the reticle and substrate to return to a beginning of the stripe in which the error condition was detected, so as to re-initiate scanning at said beginning, but continuing exposure at the location in the stripe subsequent to the location where the error condition was detected.

18. The method of claim 16, wherein step (iii) comprises moving the reticle and substrate to return to a location in the stripe immediately subsequent to the location where the error condition was detected, and re-initiating scanning exposure of the stripe at said location.

* * * * *

UNITED STATES PATENT AND TRADEMARK OFFICE
CERTIFICATE OF CORRECTION

PATENT NO.    : 6,156,464
DATED         : December 5, 2000
INVENTOR(S)   : Kazunari Hada It is certified that error appears in the above-identified patent and that said Letters Patent is hereby corrected as shown below:

Column 2,
Line 66, change "VS" to -- $V_S$ --;

Column 13,
Line 22, change "patternexposure" to -- pattern-exposure --.

Signed and Sealed this

Thirtieth Day of July, 2002

Attest:

JAMES E. ROGAN
Attesting Officer          Director of the United States Patent and Trademark Office